(12) United States Patent
Yam

(10) Patent No.: US 7,038,840 B1
(45) Date of Patent: May 2, 2006

(54) DISCRETE RAMAN FIBER OSCILLATOR

(75) Inventor: Scott Sze Hong Yam, Stanford, CA (US)

(73) Assignee: Sprint Communications Company L.P., Overland Park, KS (US)

( * ) Notice: Subject to any disclaimer, the term of this patent is extended or adjusted under 35 U.S.C. 154(b) by 343 days.

(21) Appl. No.: 10/464,524

(22) Filed: Jun. 17, 2003

(51) Int. Cl.
*H04B 10/12* (2006.01)

(52) U.S. Cl. ..................................... 359/334

(58) Field of Classification Search ................ 359/334
See application file for complete search history.

(56) References Cited

U.S. PATENT DOCUMENTS

| | | | |
|---|---|---|---|
| 5,323,404 A * | 6/1994 | Grubb | 372/6 |
| 5,500,764 A * | 3/1996 | Armitage et al. | 359/341.33 |
| 6,407,855 B1* | 6/2002 | MacCormack et al. | 359/346 |
| 6,549,329 B1* | 4/2003 | Vail et al. | 359/334 |
| 6,862,132 B1* | 3/2005 | Casaccia et al. | 359/334 |
| 6,876,488 B1* | 4/2005 | Akasaka | 359/334 |
| 2002/0015220 A1* | 2/2002 | Papernyl et al. | 359/334 |
| 2003/0184849 A1* | 10/2003 | Le Roux et al. | 359/334 |

OTHER PUBLICATIONS

S. S. H. Yam et al., "Raman Fiber Oscillator as Optical Amplifier", IEEE Photonics Technology Letters, vol. 16, No. 6, pp. 1456-1458 (Jun. 2004).*

Y. Akasaka, I. Morita, M. -C. Ho, M. E, Marhic, and L. G. Kazovsky, "Characteristics of Optical Fibers for Discrete Raman Amplifiers," ECOC'99, Sep. 26-30, 1999, Nice, France I-288-I-289.

Stephen G. Grubb, "1.3 μm Raman Fiber Amplifiers," OFPW1.3, 1995, pp. 69-70.

* cited by examiner

*Primary Examiner*—Jack Keith
*Assistant Examiner*—Eric Bolda

(57) ABSTRACT

A discrete Raman amplifier system is disclosed comprised of a Raman gain fiber span, a first wavelength selection system coupled to a first end of the Raman gain fiber span, a second wavelength selection system coupled to a second end of the Raman gain fiber span, and a pump system. The Raman gain fiber span receives optical signals. The pump system pumps light onto the Raman gain fiber span. The first wavelength selection system and the second wavelength selection system reflect a selected wavelength on the Raman gain fiber span. The light pumped by the pump system and the selected wavelength amplify the optical signals to generate amplified optical signals.

10 Claims, 4 Drawing Sheets

DISCRETE RAMAN FIBER OSCILLATOR

BACKGROUND OF THE INVENTION

1. Field of the Invention

The invention is related to the field of communication systems, and in particular, to systems and methods of providing discrete Raman amplification of optical signals.

2. Statement of the Problem

Many communication companies use fiber optic cabling as a media for transmitting data because of its high-bandwidth capacity. Fiber optic cables reliably transport optical signals over long distances. Over a distance, optical signals attenuate in the fiber due to Rayleigh scattering. The attenuation may be recovered by an optical amplifier.

Optical amplifiers may be discrete amplifiers or distributed amplifiers. A distributed amplifier uses the transmission fiber carrying the optical signals as a gain medium. A discrete amplifier does not use the actual transmission fiber as the gain medium, but is a separate component that includes a span of rare-earth doped fiber, Dispersion Compensating Fiber (DCF), Highly Nonlinear Fiber (HNF), or another type of fiber as the gain medium.

One type of discrete amplifier is an Erbium-Doped Fiber Amplifier (EDFA). An EDFA comprises a span of Erbium-doped fiber and a Raman laser diode. The Erbium-doped fiber receives optical signals to be amplified. The laser diode transmits a laser having a wavelength of 980 nm onto the Erbium-doped fiber concurrently as the optical signals travel over the Erbium-doped fiber. The properties of the Erbium-doped fiber act to absorb the pumped laser and generate a gain in the optical signals using the absorbed laser. EDFAs are generally used to amplify optical signals in the C-band (1530 nm to 1560 nm). Other types of rare earth-doped discrete amplifiers are used to amplify other bands, such as the S-band and the L-band. Rare earth-doped discrete amplifiers usually have a fixed gain range that depends on the dopant used for the gain medium.

Another type of discrete amplifier is a discrete Raman amplifier. A discrete Raman amplifier comprises a span of fiber and a Raman pump. The fiber may be Dispersion Compensating Fiber (DCF) or Highly Nonlinear Fiber (HNF). Conventional discrete Raman amplifiers use a length of fiber between 4 to 10 km. The fiber receives optical signals to be amplified. The Raman pump transmits a laser onto the fiber concurrently as the optical signals travel over the fiber. Due to the Raman effect, the laser generates a gain in the optical signals.

The gain range of discrete Raman amplifiers is flexible and depends on the wavelength of the pump laser. The laser amplifies wavelengths at one Raman Stokes shift from the laser wavelength. A first order Raman Stokes shift comprises the wavelengths about 100 nm longer than the pump laser wavelength in glass fiber. For instance, a 1455 nm pump laser wavelength amplifies optical signals having wavelengths around 1550 nm. The gain bandwidth is about 30 nm centered about the 1550 nm wavelength. This configuration is shown in FIG. 1 and discussed below.

One problem with current discrete Raman amplifiers is the high amount of double Rayleigh scattering occurring in the amplifier. The high amount of double Rayleigh scattering is due to the long length of fiber used as the gain medium. The amount of double Rayleigh scattering in the fiber is proportional to the length of the fiber. Double Rayleigh scattering limits the amount of gain that can be achieved in the discrete Raman amplifier.

SUMMARY OF THE SOLUTION

Some examples of the invention help solve the above problems with a discrete Raman amplifier system comprising a Raman gain fiber span, a first wavelength selection system, a second wavelength selection system, and a pump system. The first wavelength selection system is coupled to a first end of the Raman gain fiber span. The second wavelength selection system is coupled to a second end of the Raman gain fiber span. The Raman gain fiber span receives optical signals, such as through the first wavelength selection system. The optical signals travel over the Raman gain fiber span. The pump system pumps light on the Raman gain fiber span. The first wavelength selection system is configured to reflect a selected wavelength on the Raman gain fiber span from the first end. The second wavelength selection system is configured to reflect the selected wavelength on the Raman gain fiber span from the second end. The light pumped by the pump system and the selected wavelength amplify the optical signals in the Raman gain fiber span to generate amplified optical signals.

The discrete optical amplifier system advantageously has a much shorter length of fiber span as the gain medium than prior systems. Consequently, the double Rayleigh scattering is much less than conventional discrete Raman amplifiers. The discrete Raman amplifier system of the invention provides a later onset of gain saturation, a smaller transient spike, a lower noise figure, and a higher signal stimulated Brillouin scattering threshold. Also, the cross phase modulation is reduced for certain channel spacing.

The invention may include other examples described below.

DESCRIPTION OF THE DRAWINGS

The same reference number represents the same element on all drawings.

DETAILED DESCRIPTION OF THE INVENTION

Figure 1:
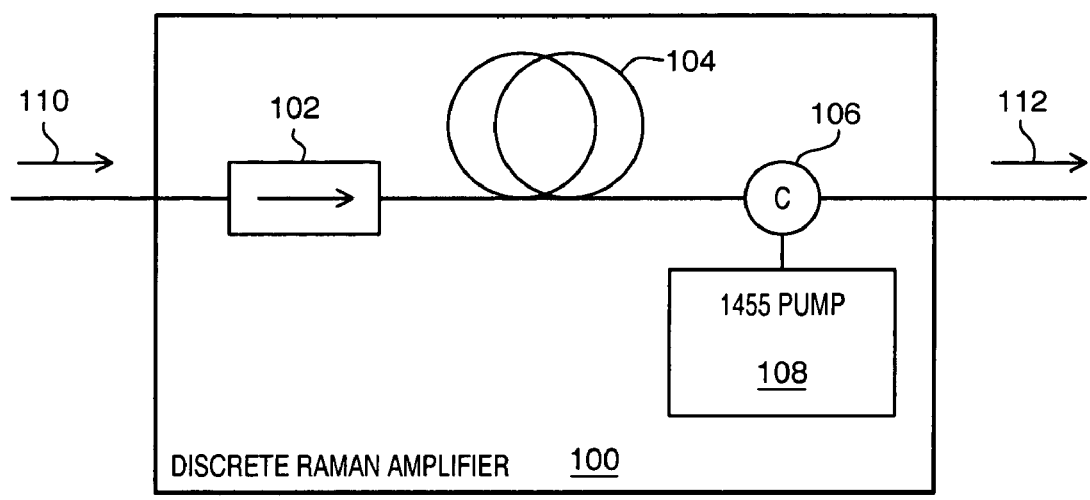
FIG. 1 illustrates a discrete Raman amplifier in the prior art.
Figure 2:
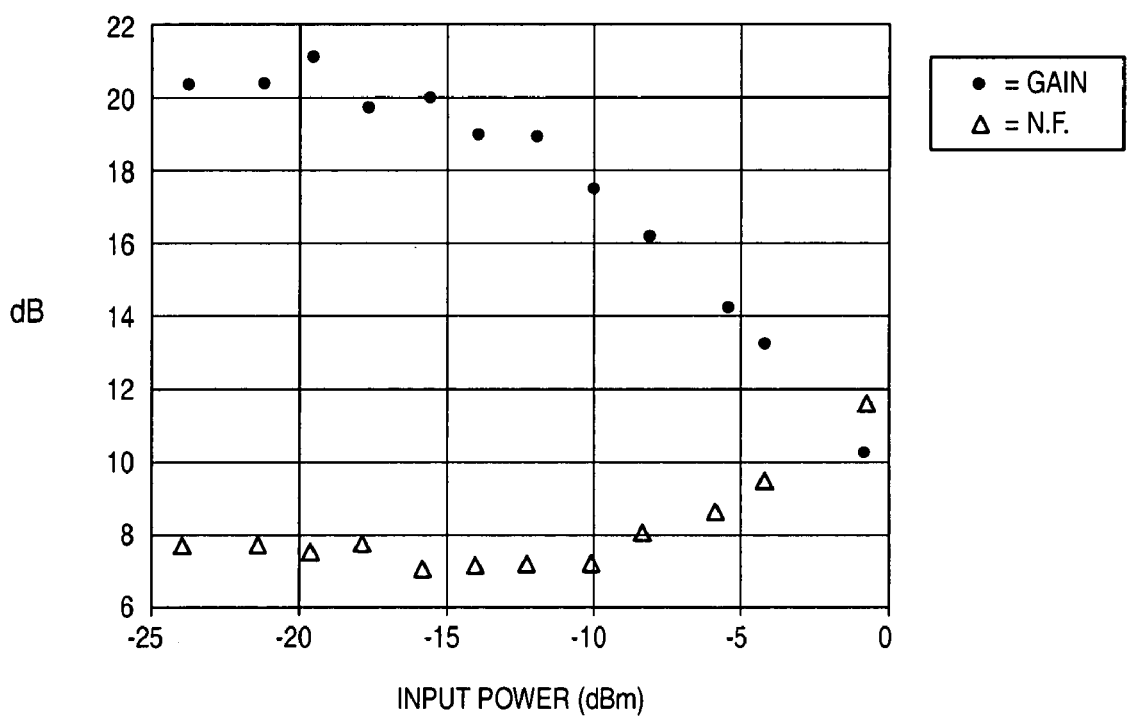
FIG. 2 illustrates a gain and noise figure (NF) generated by the discrete Raman amplifier in FIG. 1 in the prior art.

FIGS. 1–2 illustrate prior art to help in understanding the invention. FIGS. 3–6 and the following description depict specific examples of the invention to teach those skilled in the art how to make and use the best mode of the invention. For the purpose of teaching inventive principles, some conventional aspects of the invention have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

Prior Art Discrete Raman Amplifier—FIGS. 1–2

FIG. 1 illustrates a discrete Raman amplifier 100 in the prior art. Discrete Raman amplifier 100 is comprised of an isolator 102, a Dispersion Compensating Fiber (DCF) 104, a circulator 106, and a pump 108. Isolator 102 and circulator 106 are coupled to DCF 104. Pump 108 is coupled to circulator 106. DCF 104 has a length of 8 km. Pump 108 is a 1455 nm Raman laser set at 580 mW.

In operation, isolator 102 receives optical signals 110. Isolator 102 guarantees forward propagation of wavelengths through discrete Raman amplifier 100. The optical signals 110 pass through isolator 102 and onto DCF 104. Concurrently, pump 108 backward pumps a laser having a wavelength of 1455 nm on DCF 104 through circulator 106. The 1455 nm laser amplifies the optical signals 110 traveling over DCF 104 due to the Raman Effect to generate amplified optical signals 112. The 1455 nm laser amplifies the optical signals 110 having wavelengths that are about 100 nm longer than the 1455 nm laser (about 1550 nm). Discrete Raman amplifier 100 generates a gain bandwidth of about 30 nm centered about the 1550 nm wavelength of the optical signals 110.

FIG. 2 illustrates a gain and noise figure (NF) generated by discrete Raman amplifier 100 in the prior art. A black dot on FIG. 2 illustrates samples of the gain generated by discrete Raman amplifier 100 over a range of input powers for the optical signals 110. A triangle on FIG. 2 illustrates samples of the noise figure (NF) generated by discrete Raman amplifier 100 over the same range of input powers for the optical signals 110. Looking at the gain, discrete Raman amplifier 100 reaches 3 dB saturation as the input power of the optical signals 110 approach about −10 dBm.

EXAMPLE #1

FIG. 3

Figure 3:
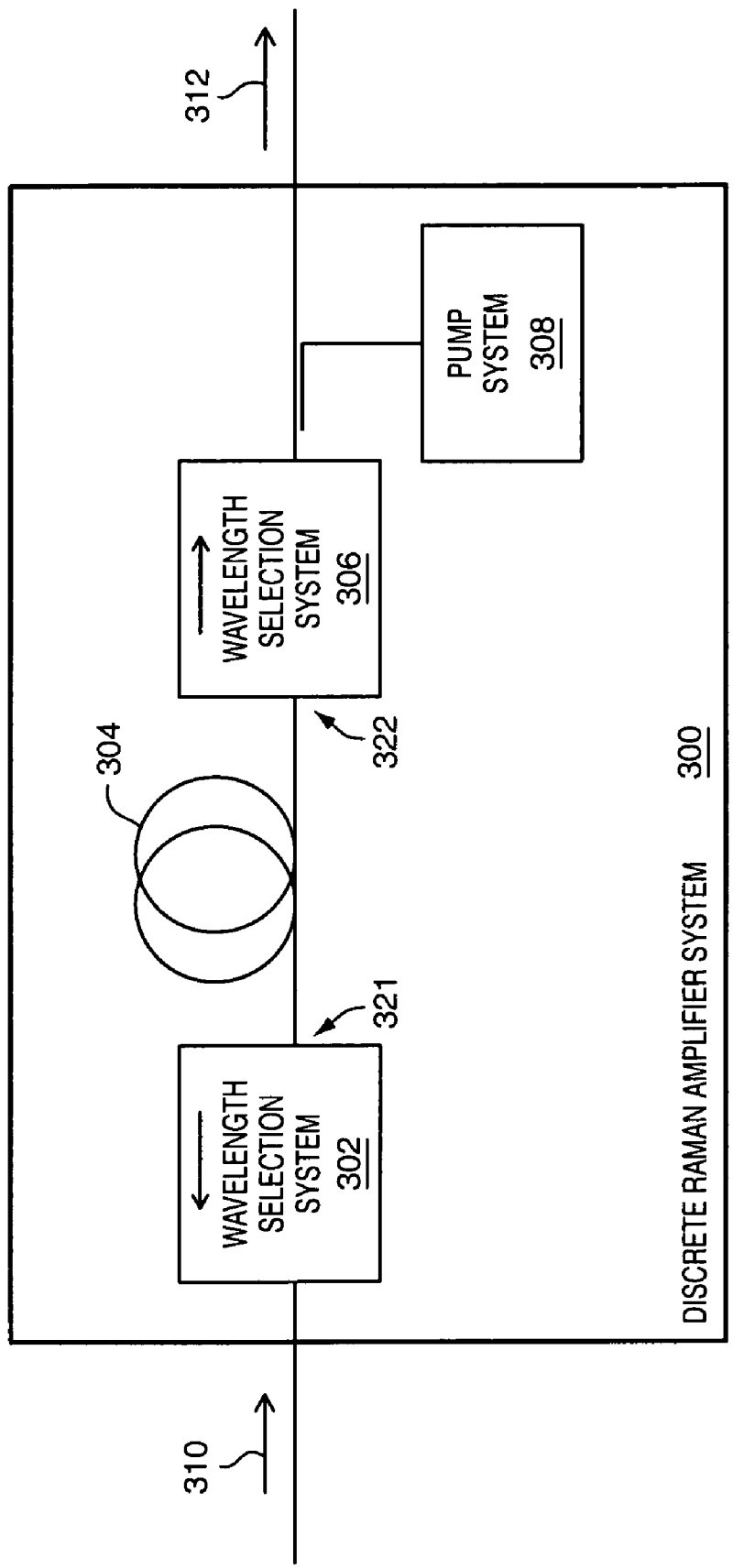
FIG. 3 illustrates a discrete Raman amplifier system in an example of the invention.

FIG. 3 illustrates a discrete Raman amplifier system 300 in an example of the invention. Discrete Raman amplifier system 300 is comprised of a wavelength selection system 302, a Raman gain fiber span 304, a wavelength selection system 306, and a pump system 308. Wavelength selection system 302 is coupled to a first end 321 of Raman gain fiber span 304. Wavelength selection system 306 is coupled to a second end 322 of Raman gain fiber span 304.

Pump system 308 is configured to pump light on Raman gain fiber span 304. Pump system 308 is illustrated as backward pumping the light on Raman gain fiber span 304. Pump system 308 may also forward pump the light on Raman gain fiber span 304, which is within the scope of the invention.

The following definitions help to define the invention. A wavelength selection system comprises any system, device, or component configured to reflect certain wavelengths of the optical signals and allow certain wavelengths of the optical signals to pass. One example of a wavelength selection system is a fiber Bragg grating. A Raman gain fiber span comprises a length of fiber providing a medium wherein light amplifies optical signals due to the Raman Effect. Examples of a Raman gain fiber span comprises a Dispersion Compensating Fiber (DCF) span and a Highly Nonlinear Fiber (HNF) span. The Raman gain fiber span may have a length less than 2 km, less than 1.5 km, less than 1 km, etc. A pump system comprises any system, device, or component configured to pump light onto an optical fiber. Examples of a pump system are a Raman fiber laser, or a Raman fiber laser in combination with a circulator.

In operation, Raman gain fiber span 304 receives optical signals 310 to be amplified, such as through wavelength selection system 302. The optical signals 310 travel over Raman gain fiber span 304 from the first end 321 to the second end 322. Pump system 308 pumps light on Raman gain fiber span 304.

Wavelength selection system 306 reflects a selected wavelength on Raman gain fiber span 304. Wavelength selection system 306 allows the other wavelengths to pass. Wavelength selection system 302 also reflects the selected wavelength on Raman gain fiber span 304. Wavelength selection systems 302 and 306 may reflect multiple wavelengths.

The light pumped by pump system 308 and the selected wavelength amplify the optical signals 310 to generate amplified optical signals 312. The light pumped by pump system 308 and the selected wavelength amplify the optical signals 310 due to the Raman effect in the Raman gain fiber span 304. Wavelength selection system 306 then passes the amplified optical signals 312 out of discrete Raman amplifier system 300. Based on this disclosure, those skilled in the art will understand how to modify existing discrete Raman amplifiers to make discrete Raman amplifier system 300.

In one embodiment, the wavelength of the light pumped by pump system 308 corresponds to the selected wavelength reflected by wavelength selection system 306 and wavelength selection system 302. The selected wavelength reflected by wavelength selection system 306 and wavelength selection system 302 is about one Raman Stokes shift (about 100 nm) from the light pumped by pump system 308.

Illustrating the operation of this embodiment, pump system 308 injects light on Raman gain fiber span 304. The injected light amplifies the selected wavelength due to the Raman Effect. Wavelength selection system 306 and wavelength selection system 302 reflect the selected wavelength on Raman gain fiber span 304 to "trap" the selected wavelength in Raman gain fiber span 304. In other words, the selected wavelength oscillates between wavelength selection system 306 and wavelength selection system 302 on Raman gain fiber span 304. The selected wavelength then has high enough intensity in Raman gain fiber span 304 to amplify the optical signals 310 due to the Raman Effect to generate the amplified optical signals 312.

In another embodiment, wavelength selection systems 302 and 306 are configured to reflect a selected wavelength and transmit other wavelengths. The arrows in wavelength selection systems 302 and 306 illustrate the propagation direction of the selected wavelength before reflection. Referring to FIG. 3, wavelength selection system 302 reflects the selected wavelength traveling from right to left on FIG. 3 so that the selected wavelength is reflected back on Raman gain fiber span 304. Wavelength selection system 306 reflects the selected wavelength traveling from left to right on FIG. 3 so that the selected wavelength is reflected back on Raman gain fiber span 304. Together, a resonant cavity is formed.

EXAMPLE #2

FIGS. 4–6

Figure 4:
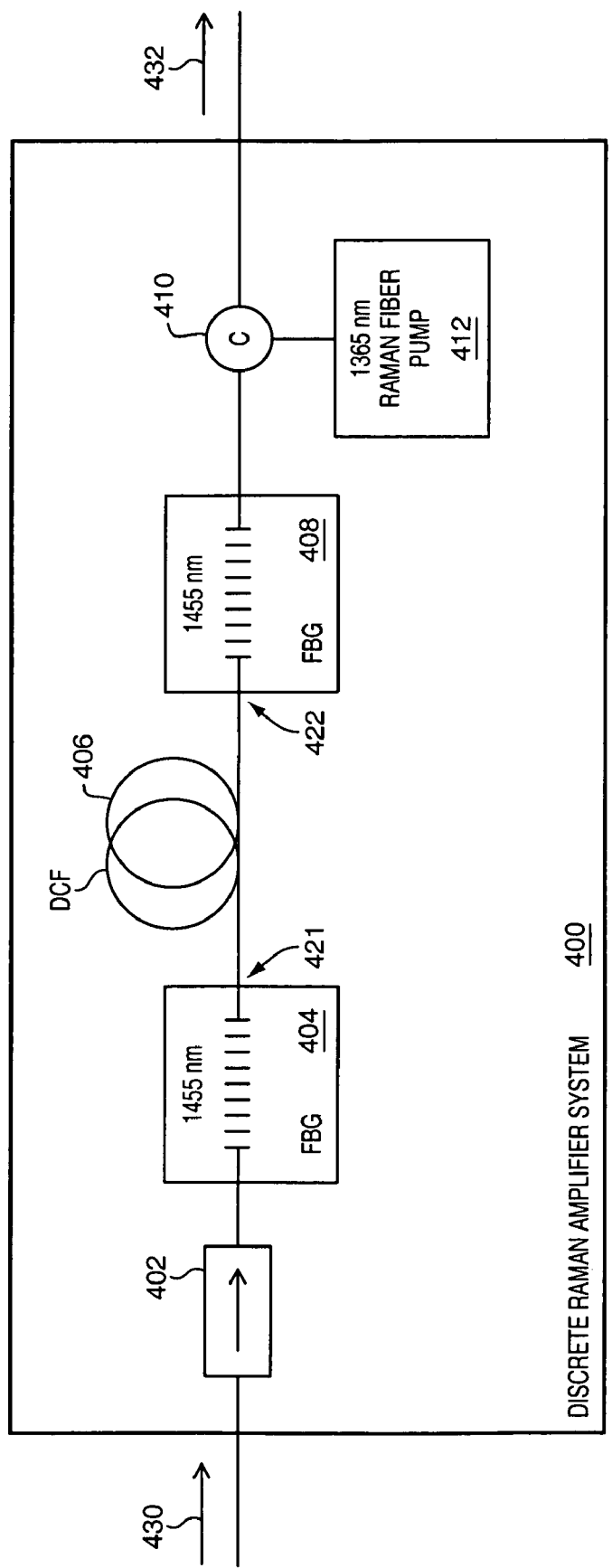
FIG. 4 illustrates another example of a discrete Raman amplifier system in an example of the invention.

FIG. 4 illustrates another example of a discrete Raman amplifier system 400 in an example of the invention. Discrete Raman amplifier system 400 may also be referred to as a discrete Raman fiber oscillator. Discrete Raman amplifier system 400 is comprised of an isolator 402, a fiber Bragg grating 404, a Dispersion Compensating Fiber (DCF) 406, a fiber Bragg grating 408, a circulator 410, and a pump 412. Isolator 402 is coupled to fiber Bragg grating 404. Fiber Bragg grating 404 is coupled to DCF 406 at a first end 421. Fiber Bragg grating 408 is coupled to DCF 406 at a second end 422. Fiber Bragg grating 408 is also coupled to circulator 410. Pump 412 is coupled to circulator 410.

Fiber Bragg grating 404 and fiber Bragg grating 408 are each highly-reflective fiber Bragg gratings centered at about 1455 nm. Fiber Bragg grating 404 has a 10 dB suppression width of 0.92 nm. Fiber Bragg grating 408 has a 10 dB suppression width of 0.92 nm. Fiber Bragg gratings 404 and 408 and DCF 406 form a resonant cavity. Total cavity loss at 1560 nm is about 3.7 dB. Intra-cavity power at 1455 nm is about 1.9 W. The connection between a fiber Bragg grating 404 or 408 has a loss that is less than 1 dB.

Pump 412 is a 1365 nm Raman fiber pump set to a power of 780 mW. Fiber Bragg gratings 404 and 408 are centered one Raman Stokes shift away from the 1365 nm pump 412. DCF 406 has a length of 1 km and has the following characteristics: 0.35 dB/km loss at 1550 nm, 0.46 dB/km loss at 1450 nm, a gain factor of 2.7/W-km at 13.2 THz Stokes-shifted peak. Discrete Raman amplifier system 400 is set to generate a 20 dB gain.

In operation, isolator 402 receives optical signals 430 and passes the optical signals 430 to fiber Bragg grating 404. Isolator 402 blocks echoes of the optical signals 430 from backward propagating and suppresses oscillation in discrete Raman amplifier system 400. Fiber Bragg grating 404 receives the optical signals 430 and passes the optical signals 430 to DCF 406. DCF 406 carries the optical signals 403 from the first end 421 to the second end 422.

Concurrently, pump 412 backward pumps a 1365 nm laser onto DCF 406 through circulator 410 and fiber Bragg grating 408. The 1365 nm laser amplifies the selected wavelength in DCF 406, that is a first Raman Stokes shift (about 1455 nm) from the 1365 nm laser, due to the Raman Effect. Fiber Bragg gratings 404 and 408 reflect the first Raman Stokes shift on DCF 406 to create a laser cavity. The first Raman Stokes shift (about 1455 nm) has very high power that acts as a pump for a second Raman Stokes shift, which is centered at about 1550 nm. Thus, the 1365 nm laser amplifies the first Raman Stokes shift, which in turn amplifies the second Raman Stokes shift (being the C-band in this example) to generate amplified optical signals 432. Fiber Bragg grating 408 then lets the amplified optical signals 432 pass out of discrete Raman amplifier system 400.

Figure 5:
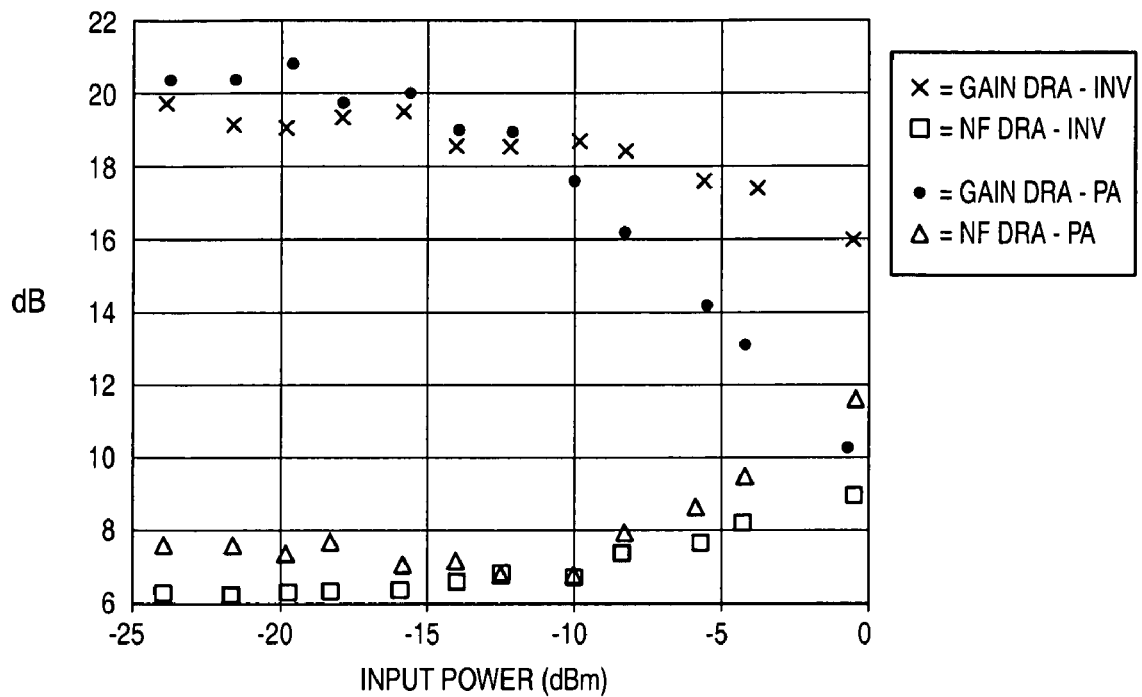
FIG. 5 illustrates a gain and noise figure (NF) generated by the discrete Raman amplifier system in FIG. 4 in an example of the invention.

FIG. 5 illustrates a gain and noise figure (NF) generated by discrete Raman amplifier system 400 (DRA-INV) in an example of the invention. An "x" on FIG. 5 illustrates samples of the gain generated by discrete Raman amplifier system 400 over a range of input powers of −25 dBm to 0 dBm for the optical signals 430. Over this range, discrete Raman amplifier system 400 does not reach 3 dB gain saturation until the input power reaches about −5 dBm.

A black dot on FIG. 5 illustrates samples of the gain generated by discrete Raman amplifier 100 (DRA-PA) in the prior art (see FIG. 1) as a comparison. The gain generated by discrete Raman amplifier 100 reaches 3 dB gain saturation earlier for the same range of input powers than discrete Raman amplifier system 400. Discrete Raman amplifier 100 reaches 3 db gain saturation at about −10 dBm, which is 5 dBm earlier than discrete Raman amplifier system 400.

A square on FIG. 5 illustrates samples of the noise figure (NF) generated by discrete Raman amplifier system 400 over the range of input powers. A triangle on FIG. 5 illustrates samples of the noise figure (NF) generated by discrete Raman amplifier 100 in the prior art (see FIG. 1). FIG. 5 shows that the noise figure for discrete Raman amplifier system 400 can be up to 1 dB lower than the noise figure for discrete Raman amplifier 100 in the prior art.

Figure 6:
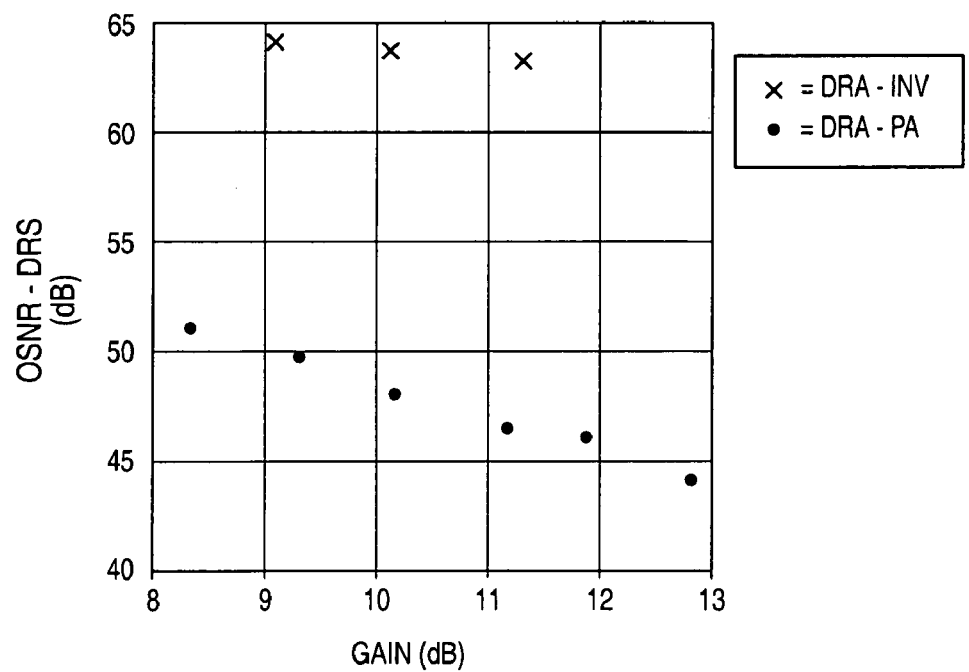
FIG. 6 illustrates a double Rayleigh scattering (DRS) Optical Signal-to-Noise Ratio (OSNR) for the discrete Raman amplifier system in FIG. 4 in an example of the invention.

FIG. 6 illustrates a double Rayleigh scattering (DRS) Optical Signal-to-Noise Ratio (OSNR) for discrete Raman amplifier system 400 (DRA-INV) in an example of the invention. An "x" on FIG. 6 illustrates samples of the DRS-OSNR generated by discrete Raman amplifier system 400 over a range of gains of 8 dB to 13 dB. Over this range, the DRS-OSNR of discrete Raman amplifier system 400 is about 64 dB. A black dot on FIG. 6 illustrates samples of the DRS-OSNR generated by discrete Raman amplifier 100 (DRA-PA) in the prior art (see FIG. 1) as a comparison. The DRS-OSNR of discrete Raman amplifier 100 in the prior art averages about 48 dB over the same gain range. The DRS-OSNR of discrete Raman amplifier system 400 is over 15 dB higher than the DRS-OSNR of discrete Raman amplifier 100 in the prior art.

Discrete Raman amplifier system 400 advantageously has much less double Rayleigh scattering due to the shorter length of DCF 406. Discrete Raman amplifier system 400 has a transient response much faster than discrete Raman amplifier 100 (see FIG. 1) because of the shorter length of DCF 406. The overall gain excursion of discrete Raman amplifier system 400 is higher than discrete Raman amplifier 100 due to the stronger Raman Stokes shifts inside the cavity. Discrete Raman amplifier system 400 also has a reduced cross phase modulation for certain channel spacing. At the same time, discrete Raman amplifier system 400 has an increased gain saturation range. Thus, discrete Raman amplifier system 400 provides many advantages over prior discrete Raman amplifiers.

What is claimed is:

1. A discrete Raman amplifier system for amplifying optical signals, the discrete Raman amplifier system comprising:
   a Raman gain fiber span;
   a first wavelength selection system coupled to a first end of the Raman gain fiber span and configured to reflect a selected wavelength on the Raman gain fiber span;
   a second wavelength selection system coupled to a second end of the Raman gain fiber span and configured to reflect the selected wavelength on the Raman gain fiber span; and
   a circulator comprising a first port, a second port, and a third port, wherein the first port of the circulator is coupled to the second wavelength selection system;
   a pump system coupled to the second port of the circulator and configured to pump light on the Raman gain fiber span to amplify the selected wavelength, wherein the selected wavelength corresponds to a first Raman Stokes shift from the light; and
   an isolator coupled to the first wavelength selection system and configured to receive the optical signals;
   wherein the light pumped by the pump system and the first and second wavelength selection systems amplify the optical signals at a second Raman Stokes shift from the light to generate amplified optical signals from the third port of the circulator.

2. The discrete Raman amplifier system of claim 1 wherein the Raman gain fiber span has a length less than 2 km.

3. The discrete Raman amplifier system of claim 1 wherein the Raman gain fiber span comprises dispersion compensating fiber.

4. The discrete Raman amplifier system of claim 1 wherein the Raman gain fiber span comprises highly nonlinear fiber.

5. The discrete Raman amplifier system of claim 1 wherein:
- the first wavelength selection system comprises a fiber Bragg grating; and
- the second wavelength selection system comprises a fiber Bragg grating.

6. A method of operating a discrete Raman amplifier system, the method comprising:
- receiving optical signals on a first end of a Raman gain fiber span through an isolator;
- pumping light on a second end of the Raman gain fiber span with a pump system through a circulator to amplify a selected wavelength corresponding to a first Raman Stokes shift from the light; and
- reflecting the selected wavelength on the Raman gain fiber span with a first wavelength selection system coupled to the first end of the Raman gain fiber span and reflecting the selected wavelength on the Raman gain fiber span with a second wavelength selection system coupled to the second end of the Raman gain fiber span;
- wherein the light pumped by the pump system and the first and second wavelength selection systems amplify the optical signals at a second Raman Stokes shift from the light to generate amplified optical signals through the circulator.

7. The method of claim 6 wherein the Raman gain fiber span has a length less than 2 km.

8. The method of claim 6 wherein the Raman gain fiber span comprises dispersion compensating fiber.

9. The method of claim 6 wherein the Raman gain fiber span comprises highly nonlinear fiber.

10. The method of claim 6 wherein:
- the first wavelength selection system comprises a fiber Bragg grating; and
- the second wavelength selection system comprises a fiber Bragg grating.

* * * * *